(12) United States Patent
Xie et al.

(10) Patent No.: US 10,950,506 B2
(45) Date of Patent: Mar. 16, 2021

(54) FORMING SINGLE AND DOUBLE DIFFUSION BREAKS

(71) Applicant: INTERNATIONAL BUSINESS MACHINES CORPORATION, Armonk, NY (US)

(72) Inventors: Ruilong Xie, Niskayuna, NY (US); Juntao Li, Cohoes, NY (US); Kangguo Cheng, Albany, NY (US); Junli Wang, Slingerlands, NY (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

(21) Appl. No.: 16/423,388

(22) Filed: May 28, 2019

(65) Prior Publication Data
US 2020/0381307 A1 Dec. 3, 2020

(51) Int. Cl.
*H01L 21/8234* (2006.01)
*H01L 21/762* (2006.01)
*H01L 27/088* (2006.01)
*H01L 29/66* (2006.01)
*H01L 29/06* (2006.01)

(52) U.S. Cl.
CPC ........ *H01L 21/823481* (2013.01); *H01L 21/76224* (2013.01); *H01L 21/823431* (2013.01); *H01L 27/0886* (2013.01); *H01L 29/0649* (2013.01); *H01L 29/66545* (2013.01)

(58) Field of Classification Search
CPC ......... H01L 21/823481; H01L 27/0886; H01L 21/76224; H01L 21/823431; H01L 29/0649; H01L 29/66545
See application file for complete search history.

(56) References Cited

U.S. PATENT DOCUMENTS

| 8,846,491 | B1 | 9/2014 | Pham et al. |
| 9,425,252 | B1 | 8/2016 | Zang et al. |
| 9,589,845 | B1 | 3/2017 | Jagannathan et al. |
| 9,673,300 | B2 | 6/2017 | Ha et al. |
| 9,847,418 | B1 | 12/2017 | Lim et al. |
| 9,865,704 | B2 | 1/2018 | Xie et al. |
| 9,899,267 | B1 | 2/2018 | Liou et al. |
| 9,917,103 | B1 | 3/2018 | Mulfinger et al. |
| 10,083,964 | B1 | 9/2018 | Reznicek et al. |
| 10,141,228 | B1 | 11/2018 | Lin et al. |
| 2004/0203238 | A1* | 10/2004 | Moll ................ H01L 29/66181 438/689 |
| 2019/0006360 | A1 | 1/2019 | Tung et al. |
| 2019/0221469 | A1* | 7/2019 | Hsu ................ H01L 21/76224 |
| 2020/0058652 | A1* | 2/2020 | Park ............... H01L 21/823828 |

* cited by examiner

*Primary Examiner* — Marcos D. Pizarro
*Assistant Examiner* — Sue Tang
(74) *Attorney, Agent, or Firm* — Cantor Colburn LLP; Douglas Pearson

(57) ABSTRACT

Fabrication methods and resulting structures for single and double diffusion breaks are provided. Aspects include forming one or more fins on a substrate, the substrate including a first region and a second region, forming a plurality of sacrificial gate structures over channel regions associated with the one or more fins, forming a single diffusion break cavity in the first region of the substrate, forming a double diffusion break cavity in the second region of the substrate, depositing a first dielectric material in the single diffusion break cavity, and depositing a second dielectric material in the double diffusion break cavity.

12 Claims, 13 Drawing Sheets

FORMING SINGLE AND DOUBLE DIFFUSION BREAKS

BACKGROUND

The present invention generally relates to fabrication methods and resulting structures for semiconductor devices. More specifically, the present invention relates to fabrication methods and resulting structures for single and double diffusion breaks.

A metal-oxide-semiconductor field-effect transistor (MOSFET) is a transistor used for amplifying or switching electronic signals. The MOSFET has a source, a drain, and a metal oxide gate electrode. The metal gate is electrically insulated from the main semiconductor n-channel or p-channel by a thin layer of insulating material, for example, silicon dioxide or glass, which makes the input resistance of the MOSFET relatively high. The gate voltage controls whether the path from drain to source is an open circuit ("off") or a resistive path ("on"). A fin type field effect transistor (FET) is a type of nonplanar MOSFET. FinFET devices include an arrangement of fins disposed on a substrate. The fins are formed from a semiconductor material. A gate stack is arranged over the fins and defines a channel region of the fins, while regions of the fins extending outwardly from the channel region define active source and drain regions of the device. Various state-of-the-art techniques can be used for forming the fin.

SUMMARY

Embodiments of the present invention are directed to a method for forming a semiconductor device. A non-limiting example of the method includes forming one or more fins on a substrate, the substrate including a first region and a second region, forming a plurality of sacrificial gate structures over channel regions associated with the one or more fins, forming a single diffusion break cavity in the first region of the substrate, forming a double diffusion break cavity in the second region of the substrate, depositing a first dielectric material in the single diffusion break cavity, and depositing a second dielectric material in the double diffusion break cavity.

Embodiments of the present invention are directed to a method for forming a semiconductor device. A non-limiting example of the method includes forming one or more fins on a substrate, the substrate including a first region and a second region, forming a sacrificial gate insulation layer over channel regions associated with the one or more fins, forming a plurality of sacrificial gate structures over the channel regions associated with the one or more fins, forming a single diffusion break cavity in the first region of the substrate, forming a double diffusion break cavity in the second region of the substrate, depositing a first dielectric material in the single diffusion break cavity, and depositing a second dielectric material in the double diffusion break cavity.

Embodiments of the invention are directed to a semiconductor device. A non-limiting example of the semiconductor device includes one or more fins formed over a substrate, the substrate including a first region and a second region, a plurality of sacrificial gate structures formed over channel regions associated with the one or more fins, a single diffusion break dielectric isolation formed in a first cavity in the first region in the substrate, wherein the first cavity contacts opposing sidewalls of a first sacrificial gate structure, a double diffusion break dielectric isolation formed in a second cavity in the second region of the substrate, wherein the second cavity contacts a second sidewall of a second sacrificial gate structure and a third sidewall of a third sacrificial gate structure.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIGS. 1-11 depict a method for forming diffusion breaks in a semiconductor structure according to embodiments of the invention, in which:

FIG. 1 depicts cross-sectional views of a portion of semiconductor structure after fabrication operations according to one or more embodiments of the invention;

FIG. 2 depicts a cross-sectional view of a portion of the semiconductor structure after fabrication operations according to one or more embodiments of the invention;

FIG. 3 depicts a cross-sectional view of a portion of the semiconductor structure after fabrication operations according to one or more embodiments of the invention;

FIG. 4 depicts a cross-sectional view of a portion of semiconductor structure after fabrication operations according to one or more embodiments of the invention;

FIG. 5 depicts a cross-sectional view of a portion of semiconductor structure after fabrication operations according to one or more embodiments of the invention;

FIG. 6 depicts a cross-sectional view of a portion of semiconductor structure after fabrication operations according to one or more embodiments of the invention;

FIG. 7 depicts a cross-sectional view of a portion of semiconductor structure after fabrication operations according to one or more embodiments of the invention;

FIG. 8 depicts a cross-sectional view of a portion of semiconductor structure after fabrication operations according to one or more embodiments of the invention;

FIG. 9 depicts a cross-sectional view of a portion of semiconductor structure after fabrication operations according to one or more embodiments of the invention;

FIG. 10 depicts a cross-sectional view of a portion of semiconductor structure after fabrication operations according to one or more embodiments of the invention;

FIG. 11 depicts a cross-sectional view of a portion of semiconductor structure after fabrication operations according to one or more embodiments of the invention;

Figure 1:
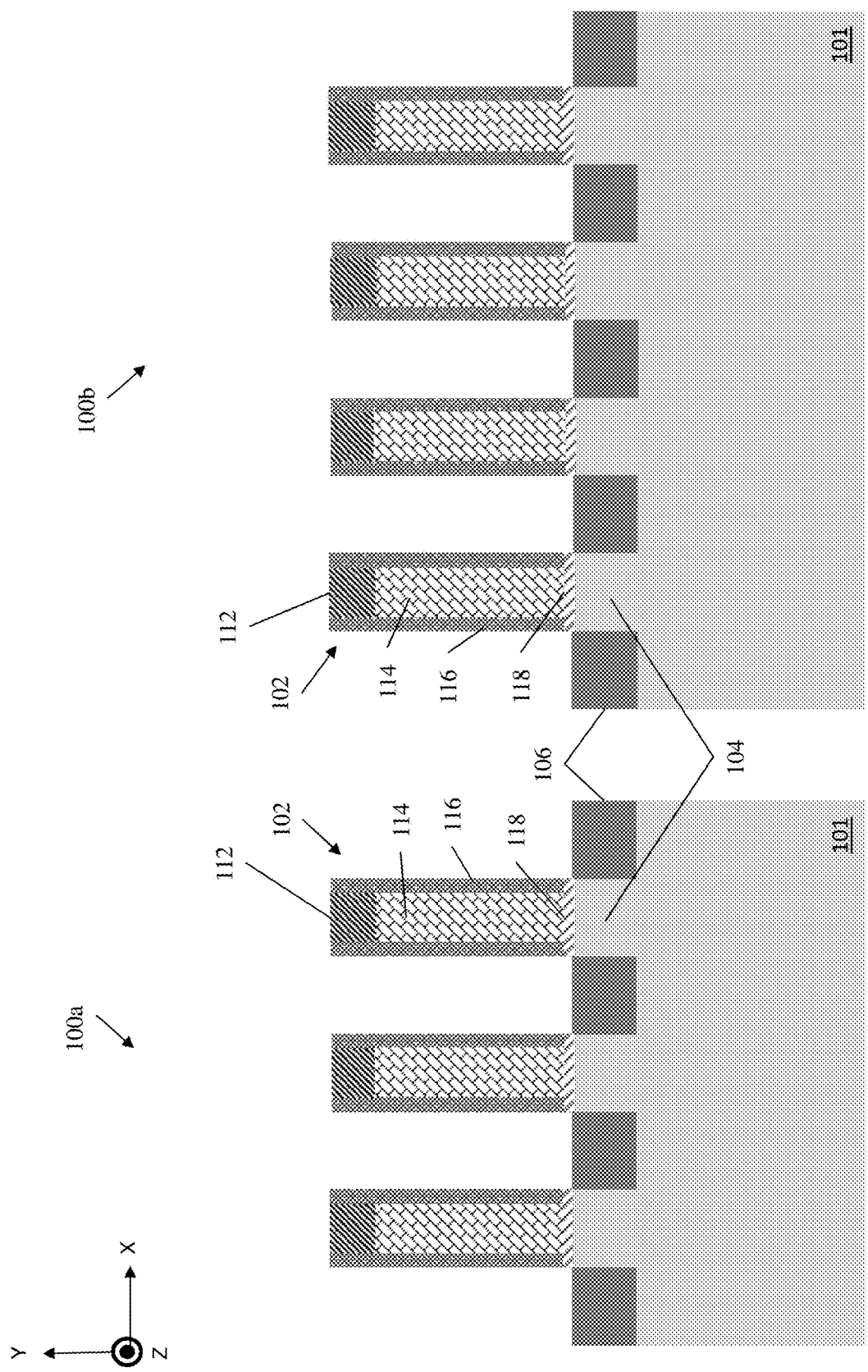

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the described embodiments, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the invention, isolation techniques in an integrated circuit attempt to prevent electric current leakage between adjacent semiconductor device components. Some processes such as shallow trench isolation (STI) are created early during the semiconductor device fabrication process, typically before transistors are formed. With the continuous scaling and increasingly demanding requirements to performances such as speed and functionality of high-density integrated circuits, semiconductor devices need to continuously reduce space between active (Rx) regions on a semiconductor substrate. More specifically, as integrated circuits are scaled down, the shallow trench isolation (STI) regions used to electrically isolate Rx regions must also be scaled down. Conventionally, multiple Rx regions in a semiconductor integrated circuit typically include arrays of parallel fins having fin ends abutting the edges of each Rx region. Portions of the fins are removed to define regions where isolation regions will be formed to electrically isolate the various devices. The space previously occupied by the removed portions of the fins is then filled with an insulating material. After the fins are cut, and the isolation regions are formed, the gate structures are then formed across the fins. The fin arrays are terminated by dummy gates, which extend laterally across the ends of the fins at the edges of the Rx regions. The dummy gates are used to induce symmetrical epitaxial growth of source/drain regions (S/D regions) on the end portions of the fins located between the dummy gates and adjacent active gates. These conventional isolation regions, such as STI regions, which are used to separate multiple active device regions becomes increasingly problematic as they consume a lot of area, which impact the device density as integrated circuits are scaled down to 14 nm node or beyond. Therefore, in order to reduce the width of conventional isolation regions, single diffusion and double diffusion breaks have been developed to terminate two opposing fin arrays (i.e., fin-ends to fin-ends) between adjacent Rx regions. By way of example, the double diffusion break (DDB) has a lateral width (in the current transport direction or gate length direction of the finFET devices) of the isolation material between the two active regions, and the lateral width approximately corresponds to the lateral width of two of the gate structures. The single diffusion break (SDB) has a lateral width (in the current transport direction or gate length direction of the finFET devices) of the isolation material between the two active regions is less than the lateral width of a single gate structure. Although the single diffusion break side and double diffusion break side might appear spaced apart or separate, both single diffusion break (SDB) and double diffusion break (DDB) are formed on the same semiconductor substrate. Turning now to an overview of technologies that are more specifically relevant to aspects of the invention, both a single diffusion break and a double diffusion break are utilized for state-of-the-art technology and expected for future technology. Forming mixed single diffusion breaks and double diffusion breaks on the same device can have various issues. Mixed single and double diffusion breaks on a device can increase mask count and cost. The fin cut cannot be combined in a single mask because the technique forms the double diffusion break in the fin module and single diffusion break in the poly open (POC) module. Accordingly, the fin cut is decomposed into two processing operations. For mixed single and double diffusion breaks on a device having aggressively scaled technology and tall fins such as with a nanosheet fin device, challenges are introduced for the double diffusion break edge. Also, mixed single and double diffusion breaks utilize metal in the double diffusion break which is an additional source of parasitic capacitance. In addition, performing the fin cut process prior to formation of the gate structures can be detrimental as it relates to retaining desired stress conditions (e.g., compressive or tensile) when the fins are cut as there is no "anchoring structure" such as gate structures to source/drain epitaxy material to help maintain or at least reduce the loss of some of the desired stress created in the fins. This is particularly true when using alternative semiconductor materials (such as tensile-stressed silicon, silicon germanium) for the channel region of the FinFET device.

Turning now to an overview of the aspects of the invention, one or more embodiments of the invention address the above-described shortcomings of the prior art by providing an isolation process where the fin cut to form the isolation region is performed after a dummy (sacrificial) gate structure and the source/drain regions on the fin have been formed. The isolation mechanism for this includes a single diffusion break and a double diffusion break for electrical isolation for the integrated circuit. The double diffusion breaks can be formed in an open area defined by a fin cut mask. For the single diffusion breaks in the fins, a dummy gate typically covers an area where the single diffusion break would be performed. To address this issue, the fin cuts for the single diffusion breaks are done after the dummy gate material is removed. The single diffusion breaks can be formed in the open area defined by a fin cut mask because the fins, which are covered by dummy gates, are exposed. However, the fins that need to be removed to form double diffusion breaks are typically covered by an insulating material such as an interlayer dielectric layer on top of a source/drain region on the fin.

Turning now to an overview of aspects of the invention, one or more embodiments of the invention provide a late cut process to form a FinFET device using single diffusion break and double diffusion break. Both the single diffusion break and double diffusion break are formed by using a single mask for the fin cut which reduces the process complexity and cost. Additionally, both the single diffusion break and double diffusion break are filled with dielectric material to reduce parasitic capacitance.

Turning now to a more detailed description of aspects of the present invention, FIGS. 1-12 depict cross-sectional views of a semiconductor structure after fabrication operations in accordance with aspects of the invention. The fabrication operations depicted in the figures implement a method for forming a single diffusion barrier and a double diffusion barrier in the semiconductor structure according to embodiments of the invention. More specifically, FIG. 1 depicts two cross-sectional views of a semiconductor structure showing a single diffusion break region 100a and a double diffusion break region 100b of a substrate 101 after an initial set of fabrication operations of a method of fabricating a final semiconductor device according to one or more embodiments of the invention. In some examples, the techniques described herein can be applied to a nanosheet device instead of the finFET device. In one or more embodiments of the invention, the single diffusion break region 100a and the double diffusion break region 100b can represent different portions of the same semiconductor structure or can be separate semiconductor structures. In embodiments of the invention, the final semiconductor device can be a variety of types of MOSFETs, including, for example, non-planar n-type field effect transistors (NFET) and p-type field effect transistors (PFET). For example, the final semiconductor device can be an n-type finFET or a p-type finFET. For ease of illustration and explanation, the single diffusion region 100a and the double diffusion region 100b will be described as being part of different portions of a substrate 101. In the embodiment of the invention shown in FIG. 1, the single diffusion region 100a and double diffusion region 100b includes one or more sacrificial gates 102 formed over channel regions of one or more fins 104 formed on a substrate 101. FIG. 1 shows two regions of the substrate 101 with fins 104 formed over the substrate 101. In some embodiments of the invention, source and drain regions 106 can be epitaxially grown on exposed surfaces of the fin 104. In some embodiments of the invention, the source and drain regions 106 are formed to a thickness of about 20 nm to about 50 nm, for example 30 nm, although other thicknesses are within the contemplated scope of the invention.

The source and drain regions 106 can be epitaxially grown using, for example, vapor-phase epitaxy (VPE), molecular beam epitaxy (MBE), liquid-phase epitaxy (LPE), or other suitable processes. The source and drain regions 106 can be semiconductor materials epitaxially grown from gaseous or liquid precursors.

In some embodiments of the invention, the gas source for the epitaxial deposition of semiconductor material includes a silicon containing gas source, a germanium containing gas source, or a combination thereof. For example, a Si layer can be epitaxially deposited (or grown) from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. A germanium layer can be epitaxially deposited from a germanium gas source that is selected from the group consisting of germane, digermane, halogermane, dichlorogermane, trichlorogermane, tetrachlorogermane and combinations thereof. A silicon germanium alloy layer can be epitaxially formed utilizing a combination of such gas sources. Carrier gases like hydrogen, nitrogen, helium and argon can be used. In some embodiments of the invention, the epitaxial semiconductor materials include carbon doped silicon (Si:C). This Si:C layer can be grown in the same chamber used for other epitaxy steps or in a dedicated Si:C epitaxy chamber. The Si:C can include carbon in the range of about 0.2 percent to about 3.0 percent.

Epitaxially grown silicon and silicon germanium can be doped by adding n-type dopants (e.g., phosphorus or arsenic) or p-type dopants (e.g., Ga, B, BF2, or Al). In some embodiments of the invention, the source and drain regions 106 can be epitaxially formed and doped by a variety of methods, such as, for example, in-situ doped epitaxy (doped during deposition), doped following the epitaxy, or by implantation and plasma doping. The dopant concentration in the doped regions can range from $1\times10^{19}$ cm$^{-3}$ to $2\times10^{21}$ cm$^{-3}$, or between $1\times10^{20}$ cm$^{-3}$ and $1\times10^{21}$ cm$^{-3}$.

In some embodiments of the invention, the source and drain regions 106 are made of silicon germanium. In some embodiments of the invention, the source and drain regions 106 are made of silicon germanium having a germanium concentration of about 10 to about 65 percent, for example, 50 percent, although other germanium concentrations are within the contemplated scope of the invention. In some embodiments of the invention of the invention, the source and drain regions 106 can extend above a topmost surface of the fins 104.

In one or more embodiments, the single diffusion region 100a and double diffusion region 100b of the substrate 101 include one or more sacrificial gate structures 102 formed over channel regions of the one or more fins 104. In some embodiments of the invention, a sacrificial gate insulation layer 118 is formed prior to sacrificial gate material deposition and patterning. In some embodiments of the invention the sacrificial gate insulation layer 118 is formed using a conformal deposition process such as CVD, PECVD, UHVCVD, RTCVD, MOCVD, LPCVD, LRPCVD, ALD, PVD, chemical solution deposition, or other like process. For example, sacrificial gate insulation layer 118 can be conformally deposited over the fins 104 In some embodiments of the invention, sacrificial gate insulation layer 118 is a silicon oxide. In some embodiments, a sacrificial gate 114 is formed over the dielectric sacrificial gate insulation layer 118. The sacrificial gate 114 can be made of any suitable material, such as, for example, amorphous silicon or polysilicon. The sacrificial gate 114 can be formed using any known method for patterning a sacrificial gate, such as, for example, a polysilicon fill and a wet etch, a dry etch, or a combination of sequential wet and/or dry etches.

In some embodiments of the invention, a hard mask 112 (also known as a gate hard mask) is formed on the sacrificial gate 114. The hard mask 112 can be made of any suitable material such as, for example a silicon nitride. In some embodiments of the invention, the sacrificial gate 114 is formed by patterning the hard mask 112 and removing uncovered portions of the sacrificial gate 114 with a RIE.

Figure 2:
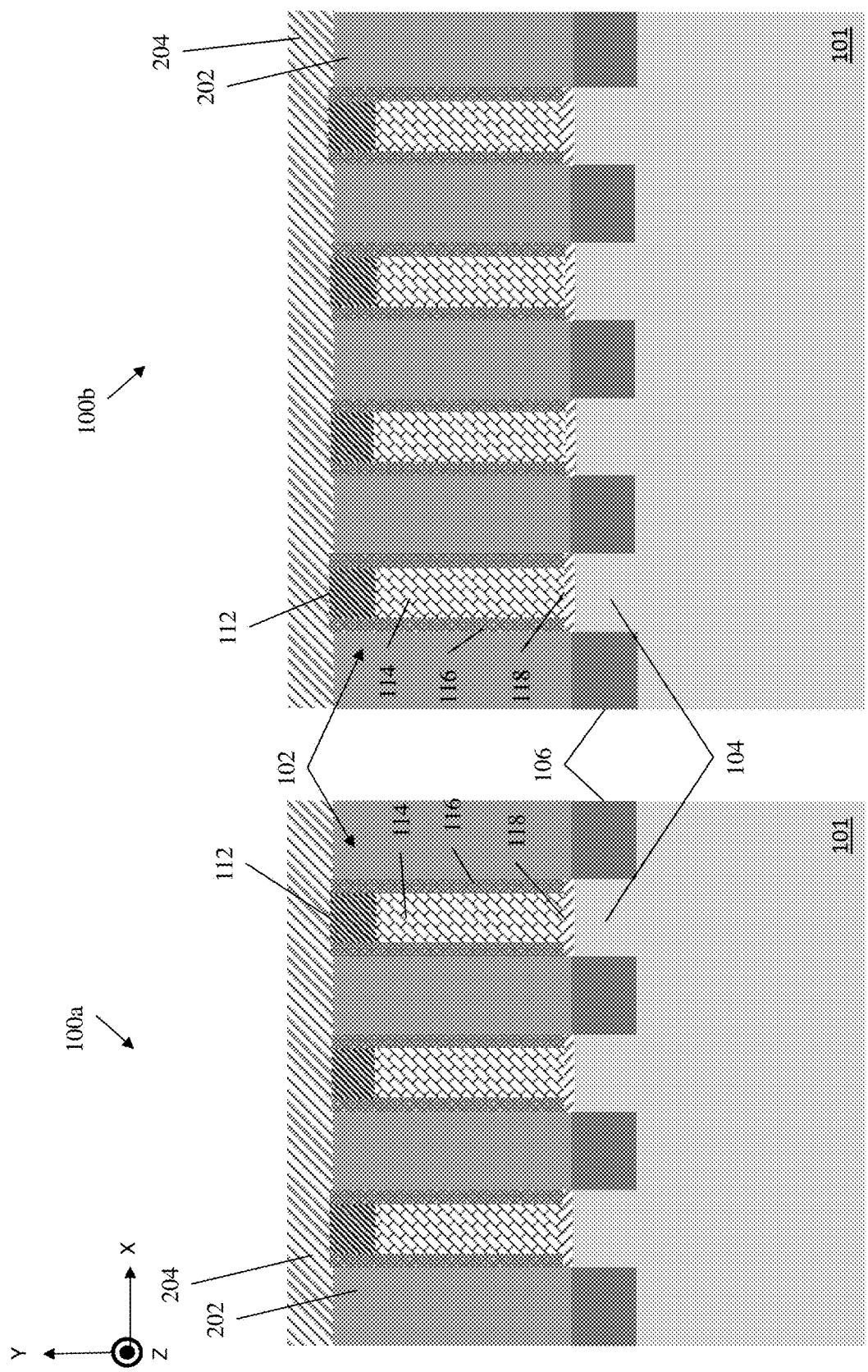

In some embodiments of the invention, gate spacers 116 are formed on sidewalls of the sacrificial gates 114 and the hard mask 112. In some embodiments of the invention, the gate spacers 116 are formed using a chemical vapor deposition (CVD), plasma-enhanced CVD (PECVD), ultrahigh vacuum chemical vapor deposition (UHVCVD), rapid thermal chemical vapor deposition (RTCVD), metalorganic chemical vapor deposition (MOCVD), low-pressure chemical vapor deposition (LPCVD), limited reaction processing CVD (LRPCVD), atomic layer deposition (ALD), physical vapor deposition (PVD), chemical solution deposition, molecular beam epitaxy (MBE), or other like process in combination with a wet or dry etch process. For example, spacer material can be conformally deposited over the sacrificial gate 114 and hard mask 112 and selectively removed using a RIE to form the gate spacers 116. The gate spacers 116 can be made of any suitable material, such as, for example, a low-k dielectric, a nitride, silicon nitride, silicon oxide, SiON, SiC, SiOCN, or SiBCN. In some embodiments of the invention, the gate spacers 116 include silicon nitride FIG. 2 depicts the single diffusion region 100a and double diffusion region 100b of the substrate 101 after a processing operation according to one or more embodiments of the invention. As illustrated in FIG. 2, an interlayer dielectric 202 can be formed over the source/drain regions 106 between adjacent sacrificial gate structures 102. The interlayer dielectric 202 can be made of any suitable dielectric material, such as, for example, porous silicates, carbon doped oxides, silicon dioxides, silicon nitrides, silicon oxynitrides, silicon carbide (SiC), or other dielectric materials. Any known manner of forming the interlayer dielectric 202 can be utilized, such as, for example, CVD, PECVD, ALD, flowable CVD, spin-on dielectrics, or PVD. In one or more embodiments of the invention, a second hard mask 204 is formed on the interlayer dielectric 202, a top portion of the gate spacers 116, and the top of the hard mask 112. The second hard mask 204 can be made of any suitable material such as, for example a silicon carbide.

Figure 3:
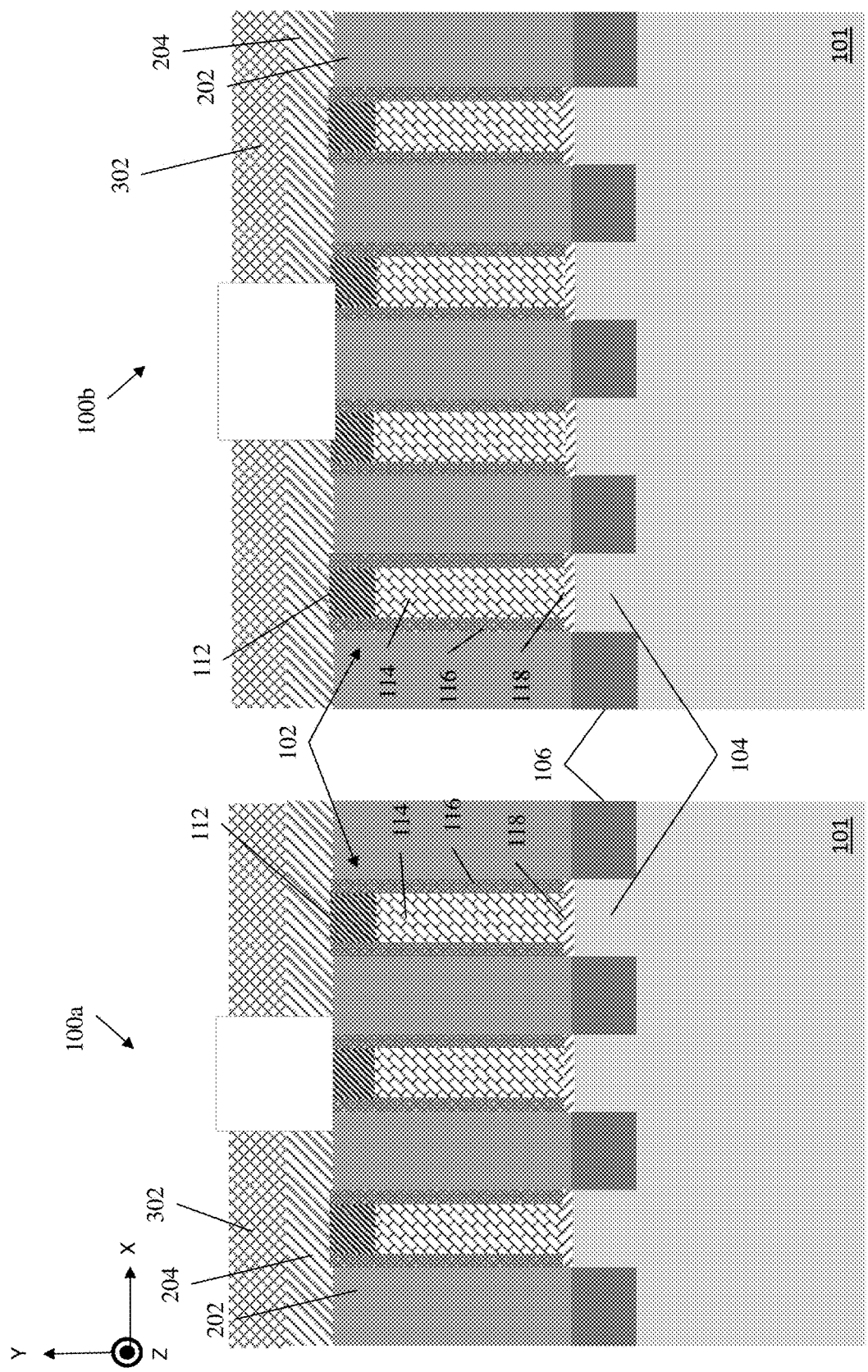

FIG. 3 depicts the single diffusion region 100a and double diffusion region 100b of the substrate 101 after a processing operation according to one or more embodiments of the invention. As illustrated in FIG. 3, a patterned hard mask 302 is formed over the second hard mask 204 and a portion of the second hard mask 204 is removed using a wet or dry etch process to selectively remove portions of the second hard mask 204 which are not covered by the patterned hard mask 302. In one or more embodiments of the invention, the etching of the second hard mask 204 layer forms an opening for later formation of the single diffusion break and the double diffusion break in the single diffusion region 100a and double diffusion region 100b of the substrate 101. In one or more embodiments of the invention, the single diffusion region 100a of the substrate 101 will have a single diffusion break (SDB) formed therein and the double diffusion region 100b of the substrate 101 will have a double diffusion break (DDB) formed therein. For the single diffusion region 100a, the etch of the second hard mask 204 exposes the hard mask 112 of the center sacrificial gate structure 102 as well as exposing a top portion of the gate spacers 116 in the center sacrificial gate structure 102. Also, for the single diffusion region 100a, top portions of the interlayer dielectric 202 are exposed with the etch of the second hard mask 204. The SDB opening is not necessarily perfectly aligned to the lower sacrificial gate structure. Similarly, the DDB opening need not be perfectly aligned to the low ILD layer between two gate structures.

In one or more embodiments of the invention, the double diffusion region 100b, an opening for the double diffusion break is etched into the second hard mask 204 which exposes portions of the hard mask 112 of the two center sacrificial gate structures 102 of the double diffusion region 100b. Also, the top portions of one sidewall 116 for each of the two center sacrificial gate structures 102 are exposed as well as the interlayer dielectric 202 between the two center sacrificial gate structures 102.

Figure 4:
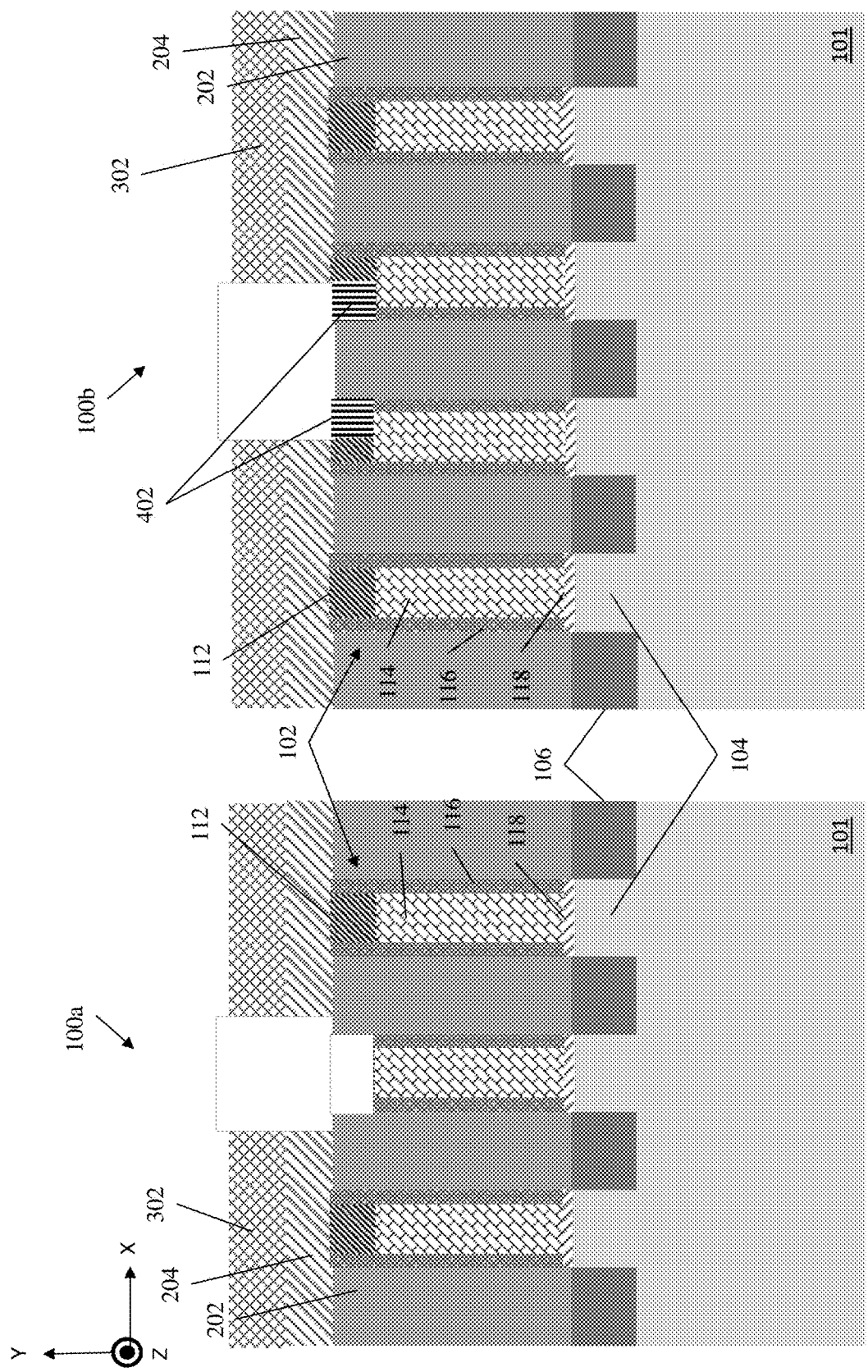

FIG. 4 depicts the single diffusion region 100a and double diffusion region 100b of the substrate 101 after a processing operation according to one or more embodiments of the invention. As illustrated in FIG. 4, for the single diffusion region 100a, a directional RIE is performed to remove portions of the hard mask 112 over the center sacrificial gate structure 102 and portions of the sidewalls 116 for the center sacrificial gate structure 102. For the double diffusion region 100b, a directional ME removes portions of the hard mask 112 over the two center sacrificial gate structures 102. The portions of the hard mask 112 removed were portions not covered by the patterned hard mask 302. A dielectric material 402 is deposited in the cavities formed in the hard mask 112 of the center two sacrificial gate structures 102 in the double diffusion region 100b. The dielectric material 402 can be deposited using any suitable process, such as, CVD, PECVD, ALD, PVD, chemical solution deposition, or other like process. For example, the dielectric material 402 can be conformally deposited on the double diffusion region 100b and etched back using any suitable etching process. The dielectric material 402 can be any suitable material, such as, a low-k dielectric, a nitride, a silicon nitride, silicon dioxide, SiON, SiC, SiOCN, or SiBCN.

Figure 5:
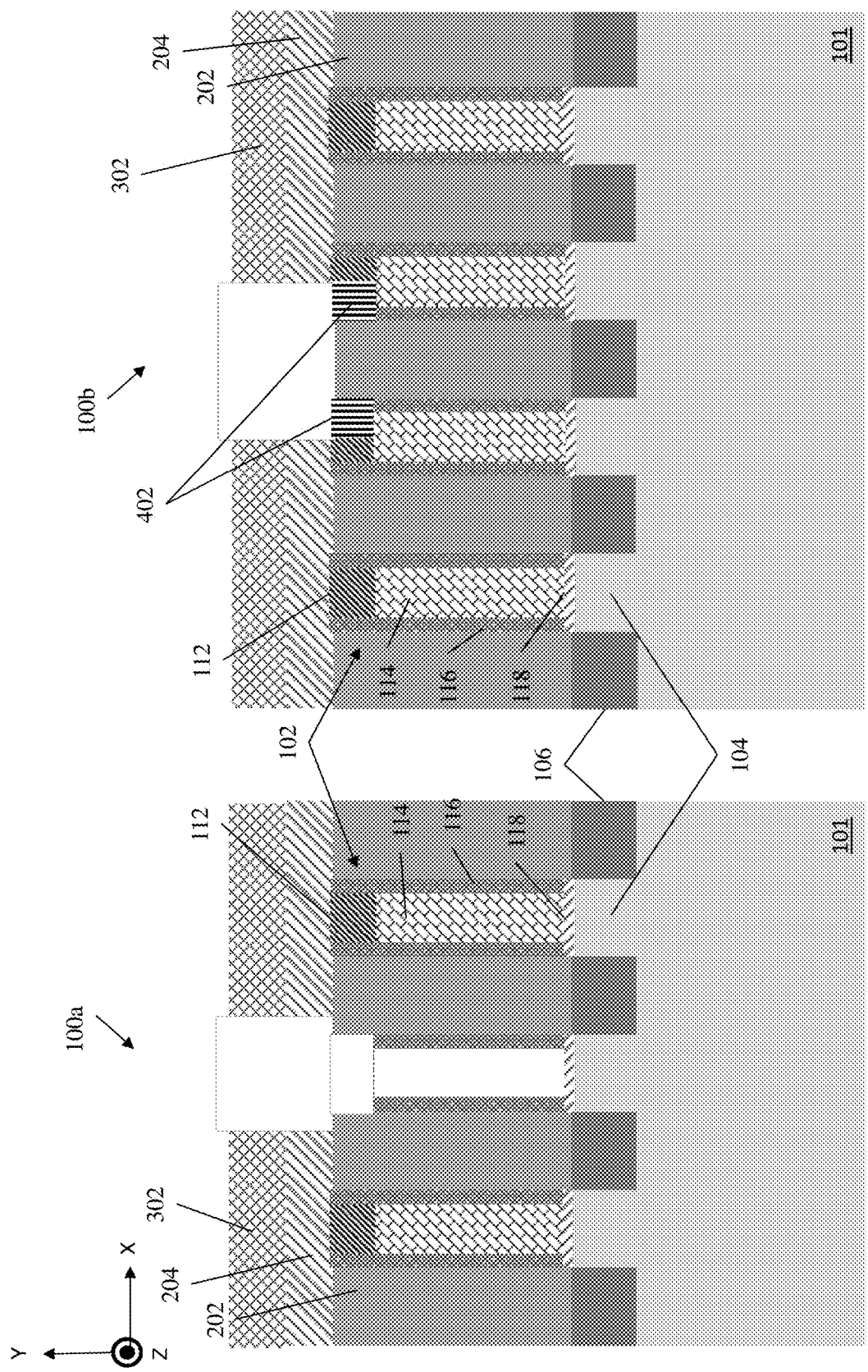

FIG. 5 depicts the single diffusion region 100a and double diffusion region 100b of the substrate 101 after a processing operation according to one or more embodiments of the invention. As illustrated in FIG. 5, the center sacrificial gate is removed in the single diffusion region 100a. Any known method for removing the sacrificial gate can be used, such as, for example, a wet etch, a dry etch, or a combination of sequential wet and/or dry etches. In some embodiments of the invention, the sacrificial gate 114 can be removed using an ashing process. In some embodiments of the invention, the sacrificial gate is removed selective to sacrificial gate insulation layer 118, sidewalls 116, and the dielectric material 402. As illustrated in FIG. 5, for the double diffusion region 100b, the center two sacrificial gates 114 are not removed because the dielectric material 402 is covering portions of the sacrificial gates that would have been exposed during the removal process of the center sacrificial gate in the single diffusion region 101a. In one or more embodiments of the invention, any gaps in the opening are pinched off.

Figure 6:
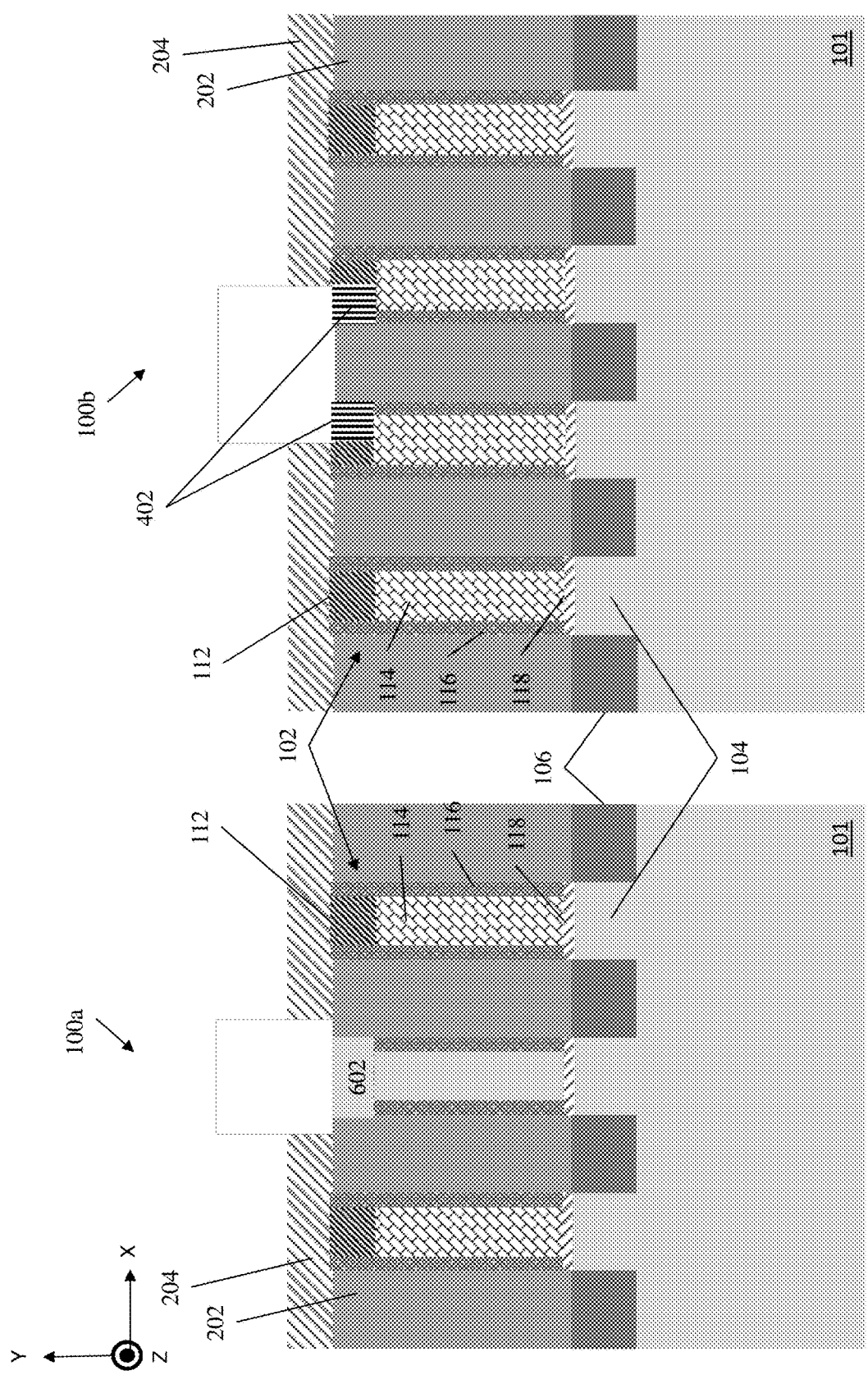

FIG. 6 depicts the single diffusion region 100a and double diffusion region 100b of the substrate 101 after a processing operation according to one or more embodiments of the invention. As illustrated in FIG. 6, the patterned hard mask 302 is removed utilizing any suitable method, such as, for example, a wet etch, a dry etch, or a combination of sequential wet and/or dry etches. In some embodiments of the invention, the patterned hard mask 302 can be removed selective to the second hard mask 204. An organic planarization layer (OPL) 602 is deposited in the cavity formed by the removal of the sacrificial gate in semiconductor structures 100a and then an OPL recess is performed. The OPL 602 can be formed by a variety of methods, such as, for example, CVD, PECVD, UHVCVD, RTCVD, MOCVD, LRPCVD, ALD, PVD, chemical solution deposition, MBE, or other like process. In some embodiments of the invention, the OPL 214 can be applied using, for example, spin coating technology. The OPL 602 can be made from any suitable OPL material. In some embodiments of the invention, the OPL 602 is planarized, using, for example, a chemical-mechanical planarization (CMP) process. The OPL 602 is deposited to protect the cavity formed by the removal of the sacrificial gate which will be later used for the single diffusion barrier.

Figure 7:
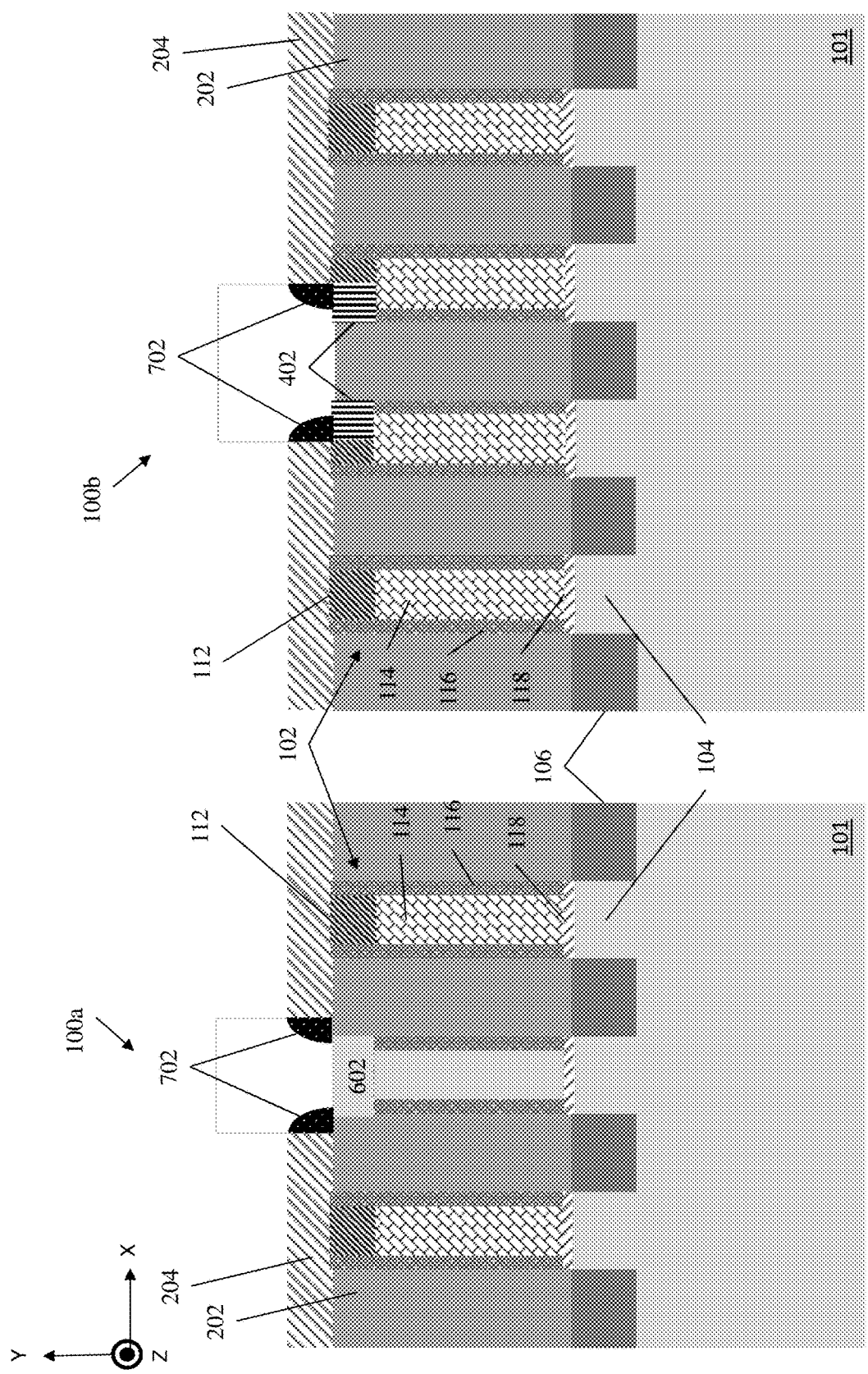

FIG. 7 depicts the single diffusion region 100a and double diffusion region 100b of the substrate 101 after a processing operation according to one or more embodiments of the invention. As illustrated in FIG. 7, inner sidewall spacers 702 are formed on the sidewalls of the second hard mask 204 covering portions of the ILD 202 in the single diffusion region 100a and covering portions of the dielectric material 402 in the double diffusion region 100b. In some embodiments of the invention, the spacers 702 are formed using a chemical vapor deposition (CVD), plasma-enhanced CVD (PECVD), ultrahigh vacuum chemical vapor deposition (UHVCVD), rapid thermal chemical vapor deposition (RT-CVD), metalorganic chemical vapor deposition (MOCVD), low-pressure chemical vapor deposition (LPCVD), limited reaction processing CVD (LRPCVD), atomic layer deposition (ALD), physical vapor deposition (PVD), chemical solution deposition, molecular beam epitaxy (MBE), or other like process in combination with a wet or dry etch process. For example, spacer material can be conformally deposited over the single diffusion region 100a and double diffusion region 100b of the substrate 101 and selectively removed using a RIE to form the spacers 702. The spacers 702 can be made of any suitable material, such as, for example, a low-k dielectric, a nitride, silicon nitride, silicon oxide, SiON, SiC, SiOCN, or SiBCN. In some embodiments of the invention, the spacers 702 include silicon nitride.

Figure 8:
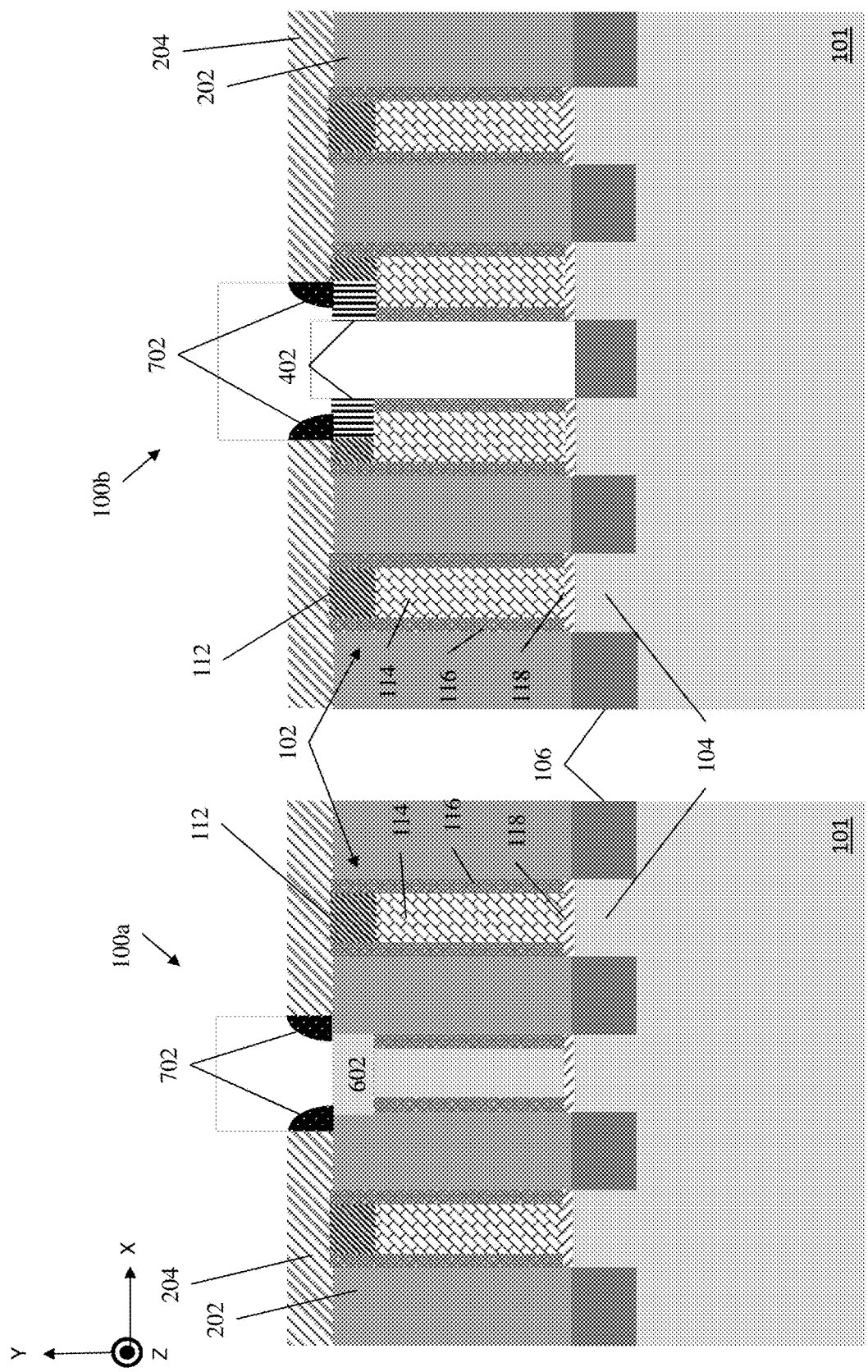

FIG. 8 depicts the single diffusion region 100a and double diffusion region 100b of the substrate 101 after a processing operation according to one or more embodiments of the invention. As illustrated in FIG. 8, a portion of the ILD 202 is removed between the two sacrificial gate structures 102 in the double diffusion region 100b. Any known method for removing the ILD 202 between the two center sacrificial gate structures 102 can be used, such as, a wet etch, a dry etch, or a combination of sequential wet and/or try etches. In some embodiments of the invention, the ILD 202 is removed selective to the spacers 702, the dielectric material 402, and sidewalls 116. In one or more embodiments of the invention, the spacers 702 and OPL 602 block the remove ILD 202 in the single diffusion region 100a.

Figure 9:
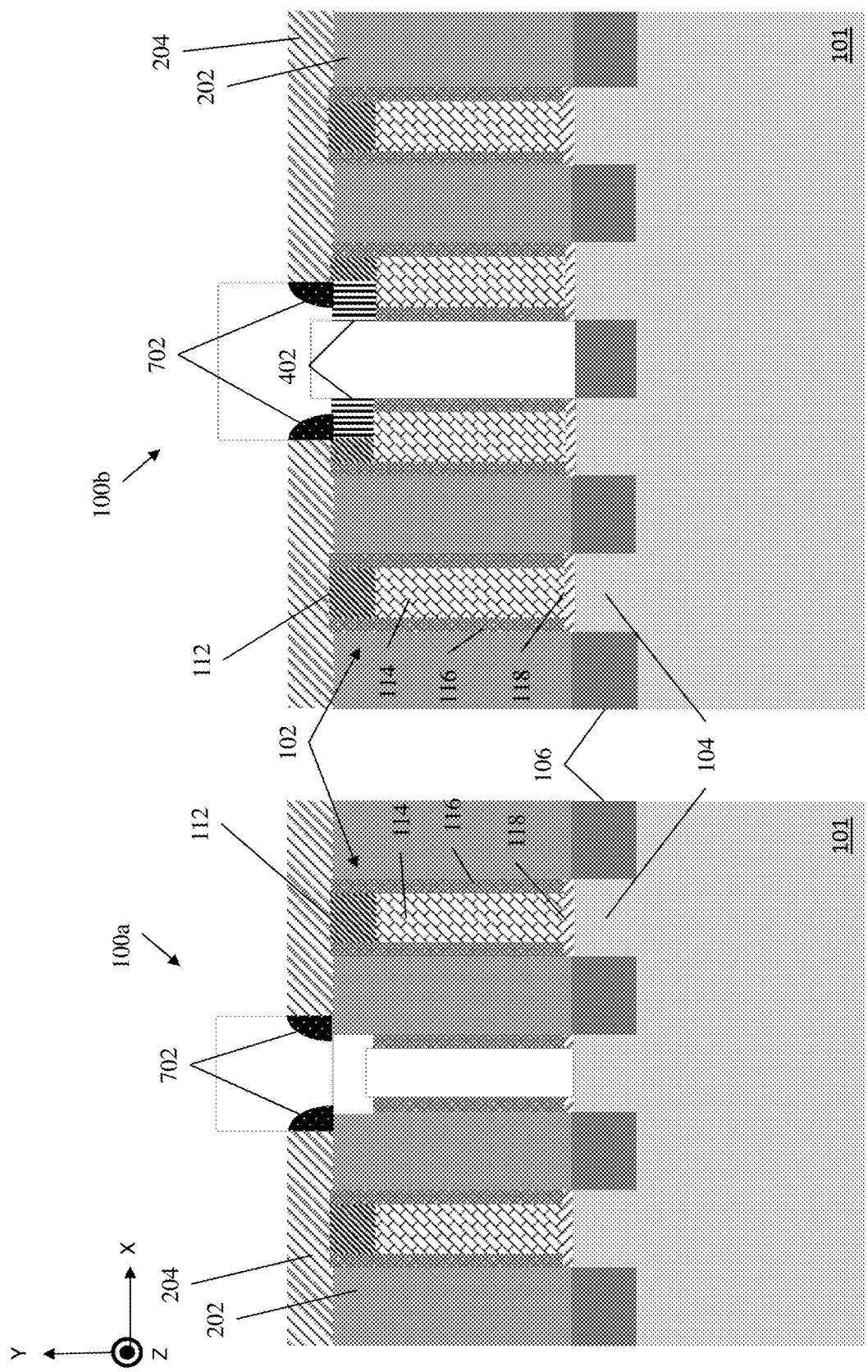

FIG. 9 depicts the single diffusion region 100a and double diffusion region 100b of the substrate 101 after a processing operation according to one or more embodiments of the invention. As illustrated in FIG. 9, the OPL is removed to expose a top portion of the dielectric liner 118 in the cavity of the center sacrificial gate structure. The OPL can be removed by an ash etch in one embodiment. In one or more embodiments of the invention, exposed portions of the dielectric liner 118 can be removed exposing portions of the fin 104. The sacrificial gate insulation layer 118 can be removed using any suitable method, such as a wet etch, a dry etch, or a combination of sequential wet and/or dry etches.

Figure 10:
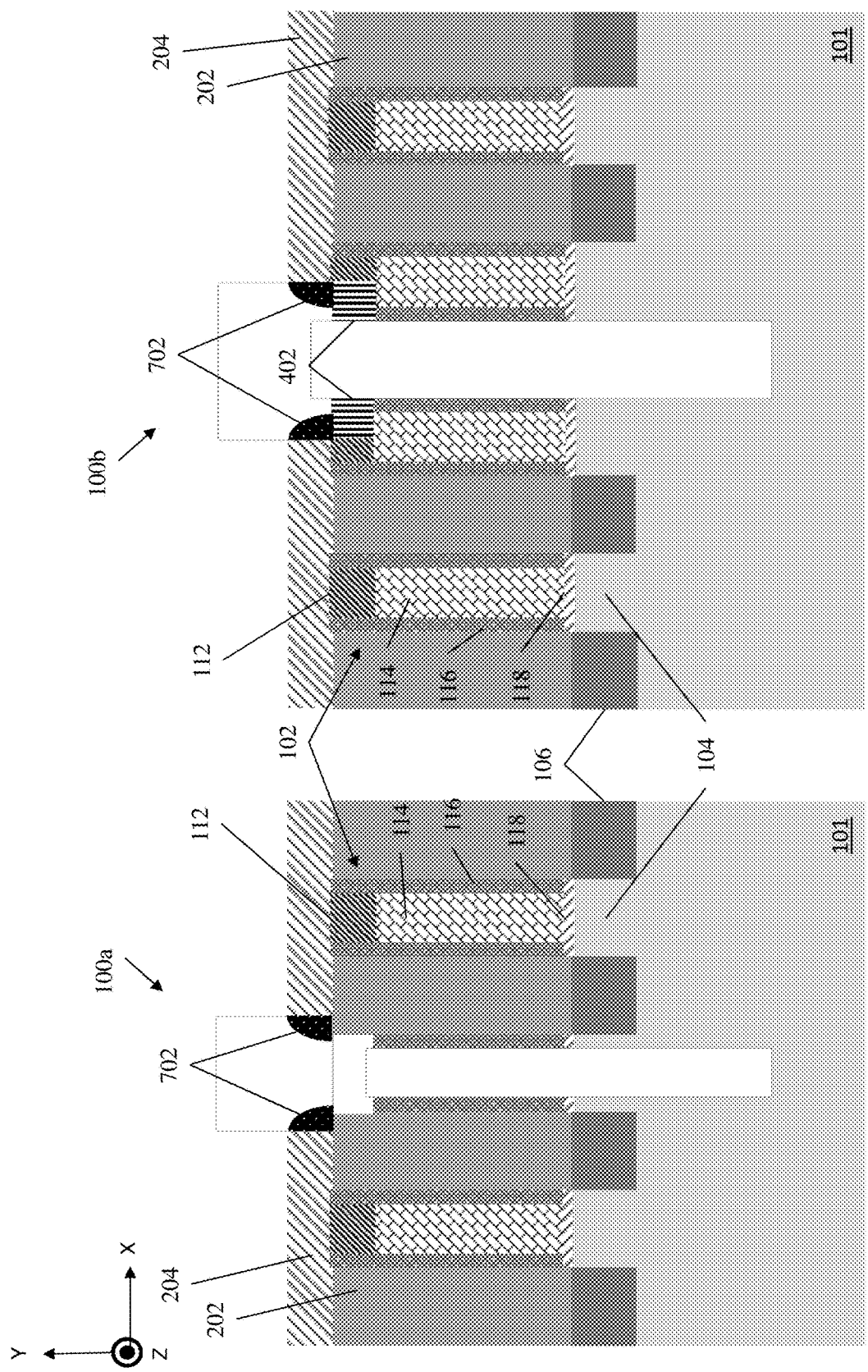

FIG. 10 depicts the single diffusion region 100a and double diffusion region 100b of the substrate 101 after a processing operation according to one or more embodiments of the invention. As illustrated in FIG. 10, a single diffusion barrier cavity is formed in the single diffusion region 100a and a double diffusion barrier cavity is formed in the double diffusion region 100b. These cavities are formed by any suitable method, such as a wet etch, a dry etch, or a combination of sequential wet and/or dry etches. In some embodiments of the invention, the cavities are formed in the substrate 101 and the source/drain region 106 by being etched selective to the spacers 702, dielectric material 402, sidewalls 116, and dielectric liner 118.

Figure 11:
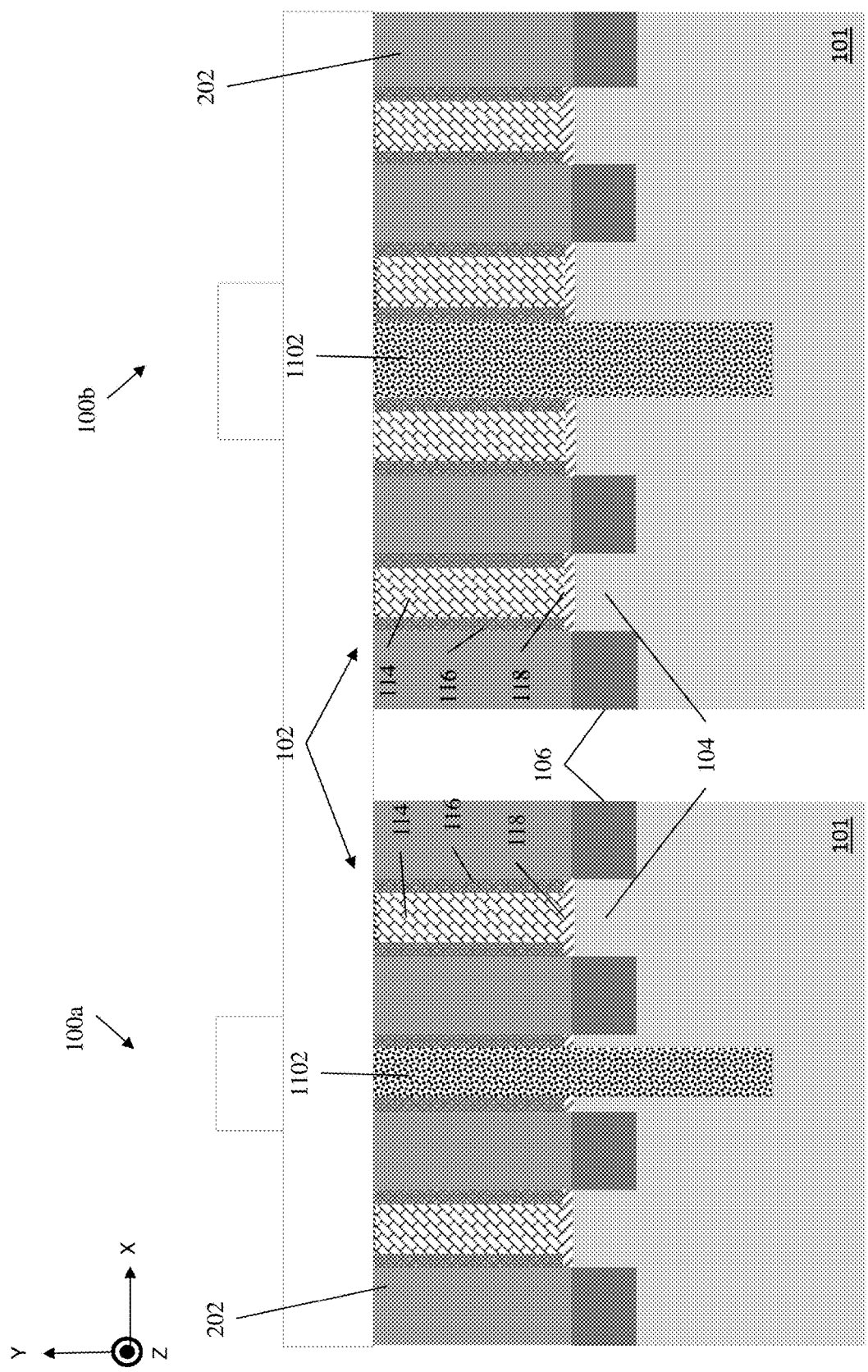

FIG. 11 depicts the single diffusion region 100a and double diffusion region 100b of the substrate 101 after a processing operation according to one or more embodiments of the invention. As illustrated in FIG. 11, an insulating dielectric material 1102 is deposited in the cavities for both the single diffusion break in the single diffusion region 100a and the double diffusion break in the double diffusion region 100b. The insulating dielectric material 1102 can be made of any suitable dielectric material, such as, for example, porous silicates, carbon doped oxides, silicon dioxides, silicon nitrides, silicon oxynitrides, or other dielectric materials. Any known manner of forming insulating dielectric material 1102 can be utilized, such as, for example, CVD, PECVD, ALD, flowable CVD, spin-on dielectrics, or PVD. In some embodiments of the invention, the second hard mask 204, the spacers 702, the hard mask 112, dielectric material 402, and portions of the sidewalls 116 can be planarized using, for example, a chemical-mechanical planarization (CMP) process. The double diffusion break (DDB) has a lateral width (in the current transport direction or gate length direction of the finFET devices) of the isolation material between the two active regions, and the lateral width approximately corresponds to the lateral width of two of the gate structures. The single diffusion break (SDB) has a lateral width (in the current transport direction or gate length direction of the finFET devices) of the isolation material between the two active regions is less than the lateral width of a single gate structure. Although the single diffusion break side and double diffusion break side might appear spaced apart or separate, both single diffusion break (SDB) 100a and double diffusion break (DDB) 100b are formed on the same semiconductor substrate.

Figure 12:
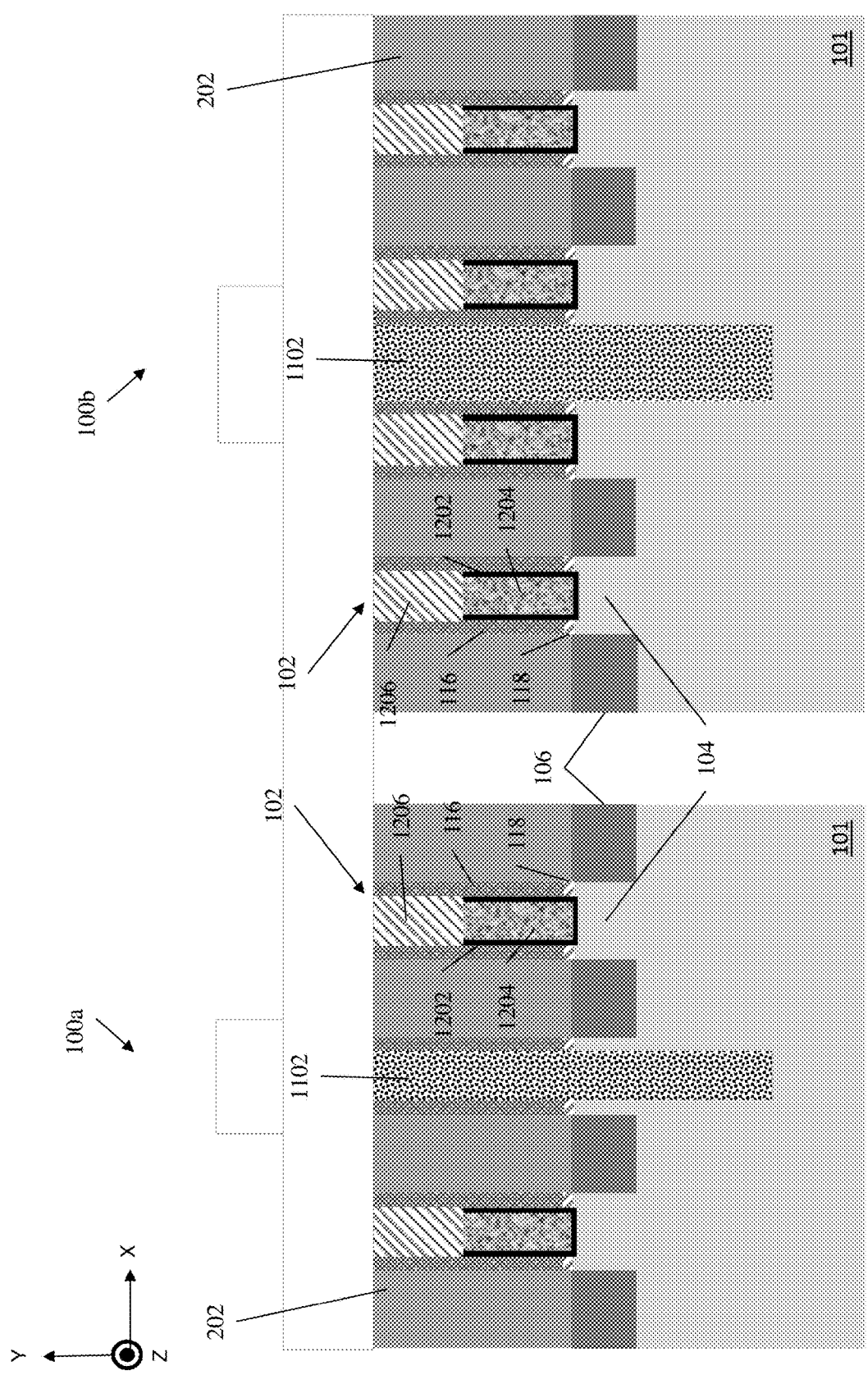
FIG. 12 depicts a cross-sectional view of a portion of semiconductor structure after fabrication operations according to one or more embodiments of the invention.

FIG. 12 depicts the single diffusion region 100a and double diffusion region 100b of the substrate 101 after a processing operation according to one or more embodiments of the invention. As illustrated in FIG. 12, the sacrificial gates 114 and portions of the sacrificial gate insulation layer 118 are removed to form cavities between the sidewalls 116 and to expose a surface of the fin 104. The sacrificial gates 114 and portions of the sacrificial gate insulation layer 118 can be removed using any suitable method such as a wet etch, a dry etch, or a combination of sequential wet and/or dry etches. In some embodiments of the invention, the sacrificial gates 114 and portions of the sacrificial gate insulation layer 118 is removed selective to the sidewalls 116. A gate dielectric 1202 and gate electrode 1204 are formed in the cavities formed from removing the sacrificial gates 114 and portions of the sacrificial gate insulation layer 118. The gate dielectric 1202 can be formed as a conformal layer, for example, by deposition of a dielectric material by CVD or ALD and etched back using any suitable method. In one embodiments, the gate dielectric 1202 is a high-k material. Examples of high-k materials include but are not limited to metal oxides such as hafnium oxide ($HfO_2$), hafnium silicon oxide (Hf—Si—O), hafnium silicon oxynitride (HfSiON), lanthanum oxide ($La_2O_3$), lanthanum aluminum oxide ($LaAlO_3$), zirconium oxide ($ZrO_2$), zirconium silicon oxide, zirconium silicon oxynitride, tantalum oxide ($Ta_2O_5$), titanium oxide ($TiO_2$), barium strontium titanium oxide, barium titanium oxide, strontium titanium oxide, yttrium oxide ($Y_2O_3$), aluminum oxide ($Al_2O_3$), lead scandium tantalum oxide, and lead zinc niobate. The high-k material can further include dopants such as lanthanum (La), aluminum (Al), and magnesium (Mg). The gate dielectric layer 228 can have a uniform thickness in the range of 1 nm to 3 nm. The gate electrode 1204 can be formed by filling remaining portions of the cavity formed from removing the sacrificial gate 114 and portions of the sacrificial gate insulation layer 118 with a conductive material. The gate electrode 1204 can be formed or deposited using known metallization techniques. The gate electrode 1204 can be made of any suitable conducting material, such as, for example, metal (e.g., tungsten, titanium, tantalum, ruthenium, zirconium, cobalt, copper, aluminum, platinum), conducting metallic compound material (e.g., tantalum nitride, titanium nitride, tantalum carbide, titanium carbide, titanium aluminum carbide, tungsten silicide, tungsten nitride, cobalt silicide, nickel silicide), conductive carbon, or any suitable combination of these materials. The gate electrode 1204 can include a metal gate or work function metal (WFM). In some embodiments, the gate electrode 1204 is formed using atomic layer deposition (ALD) or another suitable process. For nFET devices, the WFM for the gate conductor can be titanium (Ti), aluminum (Al), titanium aluminum (TiAl), titanium aluminum carbon (TiAlC), a combination of Ti and Al alloys, a stack which includes a barrier layer (e.g., of titanium nitride (TiN) or another suitable material) followed by one or more of the aforementioned WFM materials, etc. For pFET devices, the WFM for the gate conductor can be TiN, tantalum nitride (TaN), or another suitable material. In some embodiments, the pFET WFM can include a metal stack, where a thicker barrier layer (e.g., of TiN, TaN, etc.) is formed followed by a WFM such as Ti, Al, TiAl, TiAlC, or any combination of Ti and Al alloys. In some embodiments of the invention, the gate electrode 1204 is overfilled above a surface of the interlayer dielectric 202 and then recessed or planarized to surface of the interlayer dielectric 202. In some embodiments of the invention, the gate dielectric 1202 and the gate electrode 1204 are recessed by a dry etch or wet etch to form a cavity above the gate dielectric 1202 and the gate electrode 1204 and between the sidewalls 116. A gate cap 1206 is deposited in this cavity over the gate dielectric 1202 and the gate electrode 1204. The gate cap 1206 isolates the functional gate structure from a source/drain contact. The gate cap 1206 can be any suitable material such as silicon nitride, silicon carbide nitride, or silicon boron carbon nitride. The deposition of the gate cap 1206 can be performed utilizing conventional depositions process such as CVD or PECVD. Following the deposition of the gate cap 1206, the gate cap material can be planarized, for example by CMP using a top surface of the ILD 202 as an etch stop.

Figure 13:
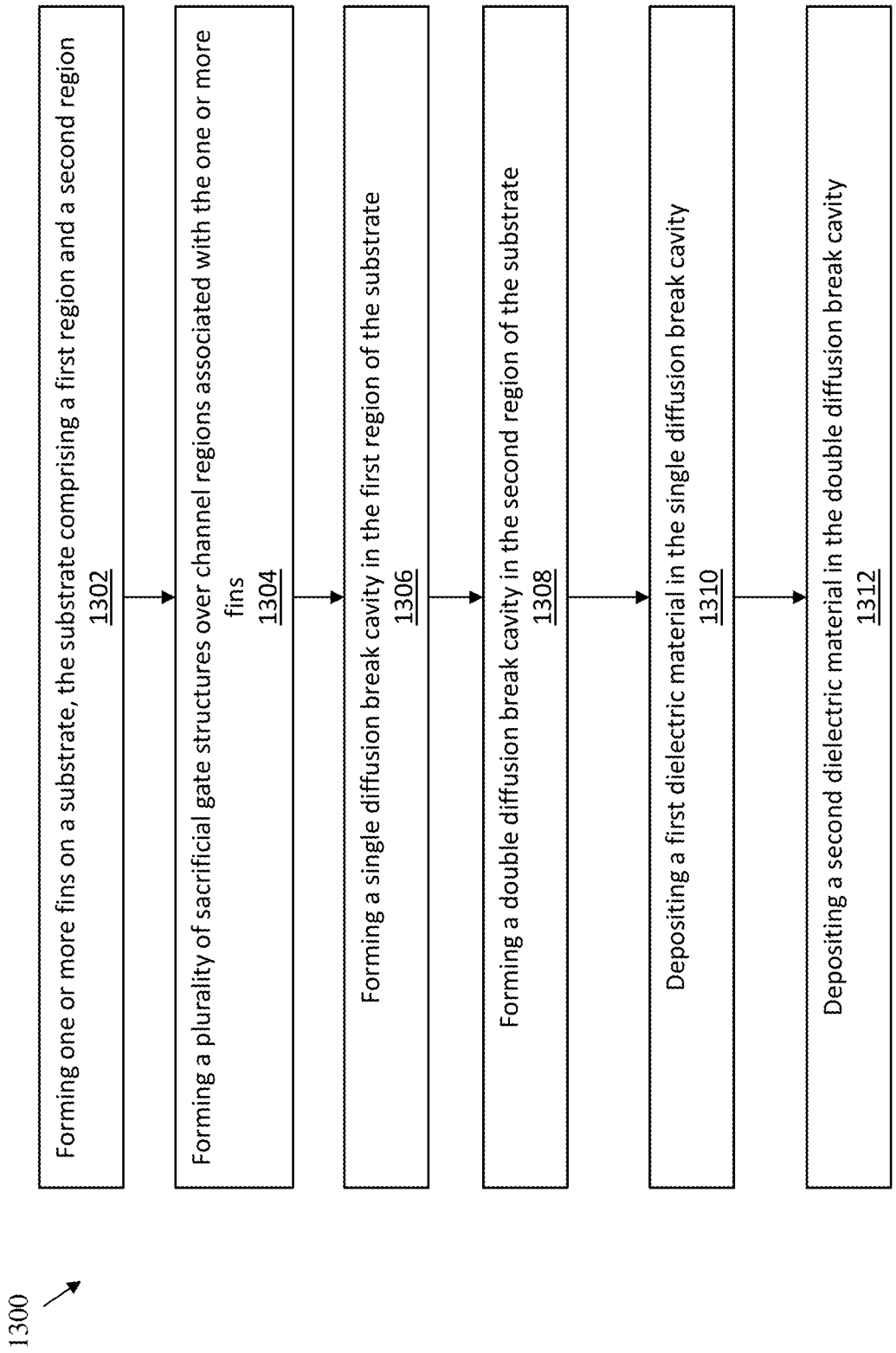
FIG. 13 depicts a flow diagram illustrating a method according to one or more embodiments of the invention.

FIG. 13 depicts a flow diagram illustrating a method for forming a semiconductor device with a single diffusion barrier and a double diffusion barrier according to one or more embodiments of the invention. The method 1300 includes forming one or more fins on a substrate, the substrate including a first region and a second region, as shown in block 1302. At block 1304, the method 1300 includes forming a plurality of sacrificial gate structures over channel regions associated with the one or more fins. The sacrificial gate structures include a gate hard mask, a sacrificial gate material, and sidewall spacers on opposing sides of the sacrificial gate structure. The method 1300, at block 1306, includes forming a single diffusion break cavity in the first region of the substrate. The single diffusion break cavity is formed between gate sidewalls of a sacrificial gate structure. At block 1308, the method 1300 includes forming a double diffusion break cavity in the second region of the substrate. The double diffusion break cavity is formed between a gate sidewall spacer of one sacrificial gate structure and another gate sidewall spacer of another sacrificial gate structure. The method 1300, at block 1310, include depositing a first dielectric material in the single diffusion break cavity. And at block 1312, the method 1300 includes depositing a second dielectric material in the double diffusion break cavity. In one or more embodiments of the invention, the first dielectric material can be the same material as the second dielectric material. In some embodiments of the invention, the first dielectric material can be a different material than the second dielectric material.

Additional processes can also be included. It should be understood that the processes depicted in FIG. 13 represent illustrations, and that other processes can be added or existing processes can be removed, modified, or rearranged without departing from the scope and spirit of the present invention.

The methods and resulting structures described herein can be used in the fabrication of IC chips. The resulting IC chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes IC chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of fabricating a semiconductor device, the method comprising:
   forming one or more fins on a substrate, the substrate comprising a first region and a second region;
   forming a plurality of sacrificial gate structures over channel regions associated with the one or more fins;
   forming a single diffusion break cavity in the first region of the substrate;
   forming a double diffusion break cavity in the second region of the substrate;
   depositing a first dielectric material in the single diffusion break cavity;
   depositing a second dielectric material in the double diffusion break cavity;

forming an interlayer dielectric layer between each sacrificial gate structure in the plurality of sacrificial gate structures; and forming a first hard mask over the interlayer dielectric and the plurality of sacrificial gate structures;

wherein forming the single diffusion break cavity in the first region of the substrate comprises:

forming a patterned hard mask over the first hard mask over the first region;

recessing a non-covered surface of the first hard mask to expose a surface of the interlayer dielectric layer and a first sacrificial gate structure, the first sacrificial gate structure comprising a first gate hard mask, a first gate sidewalls, and a first sacrificial gate material; and recessing the first gate hard mask of the first sacrificial gate structure and portions of the first gate sidewalls on opposite sides of the first sacrificial gate structure.

2. The method of claim 1, wherein forming the single diffusion break cavity in the first region of the substrate further comprises forming a spacer on exposed first gate sidewalls of the first hard mask and over the exposed surface of the interlayer dielectric layer.

3. The method of claim 2, wherein forming the single diffusion break cavity in the first region of the substrate further comprises:

removing portions of the first sacrificial gate material to expose the first gate sidewalls and to expose a surface of the substrate in the first region; and recessing the exposed surface of the substrate in the first region.

4. The method of claim 3, wherein depositing the first dielectric material in the single diffusion break cavity comprises depositing the first dielectric material between the first gate sidewalls.

5. The method of claim 1, wherein forming the double diffusion break cavity in the second region of the substrate comprises:

forming a patterned hard mask over the first hard mask over the second region;

recessing a non-covered surface of the first hard mask to expose:

a surface of the interlayer dielectric layer;

a top portion of a second sacrificial gate structure, the second sacrificial gate structure comprising a second gate hard mask, a second gate sidewall, and a second sacrificial gate material; and a top portion of a third sacrificial gate structure, the third sacrificial gate structure comprises a third gate hard mask, a third gate sidewall, and a third sacrificial gate material;

recessing an exposed portion of the second gate hard mask and the second gate sidewall to expose a surface of the second sacrificial gate material;

recessing an exposed portion of the third gate hard mask and the third gate sidewall to expose a surface of the third sacrificial gate material; and forming a dielectric cap over the exposed surfaces of the second sacrificial gate material and the third sacrificial gate material.

6. The method of claim 5, wherein forming the double diffusion break cavity in the second region of the substrate further comprises:

removing portions of the interlayer dielectric between the second sacrificial gate structure and the third sacrificial gate structure to expose a surface of the substrate in the second region; and recessing the exposed surface of the substrate in the second region.

7. A method of fabricating a semiconductor device, the method comprising:

forming one or more fins on a substrate, the substrate comprising a first region and a second region;

forming a sacrificial gate insulation layer over channel regions associated with the one or more fins;

forming a plurality of sacrificial gate structures over the channel regions associated with the one or more fins;

forming a single diffusion break cavity in the first region of the substrate;

forming a double diffusion break cavity in the second region of the substrate;

depositing a first dielectric material in the single diffusion break cavity; and depositing a second dielectric material in the double diffusion break cavity;

forming an interlayer dielectric layer between each sacrificial gate structure in the plurality of sacrificial gate structures; and forming a first hard mask over the interlayer dielectric and the plurality of sacrificial gate structures;

wherein forming the single diffusion break cavity in the first region of the substrate comprises:

forming a patterned hard mask over the first hard mask over the first region;

recessing a non-covered surface of the first hard mask to expose a surface of the interlayer dielectric layer and a first sacrificial gate structure, the first sacrificial gate structure comprising a first gate hard mask, a first gate sidewalls, and a first sacrificial gate material; and recessing the first gate hard mask of the first sacrificial gate structure and portions of the first gate sidewalls on opposite sides of the first sacrificial gate structure.

8. The method of claim 7, wherein forming the single diffusion break cavity in the first region of the substrate further comprises forming a spacer on exposed first gate sidewalls of the first hard mask and over the exposed surface of the interlayer dielectric layer.

9. The method of claim 8, wherein forming the single diffusion break cavity in the first region of the substrate further comprises:

removing portions of the first sacrificial gate material to expose the first gate sidewalls and to expose a surface of the sacrificial gate insulating layer;

recessing the surface of the sacrificial gate insulation layer to expose a surface of the substrate in the first region; and recessing the exposed surface of the substrate in the first region.

10. The method of claim 9, wherein depositing the first dielectric material in the single diffusion break cavity comprises depositing the first dielectric material between the first gate sidewalls.

11. The method of claim 7, wherein forming the double diffusion break cavity in the second region of the substrate comprises:

forming a patterned hard mask over the first hard mask over the second region;

recessing a non-covered surface of the first hard mask to expose:

a surface of the interlayer dielectric layer, a top portion of a second sacrificial gate structure, the second sacrificial gate structure comprising a second gate hard mask, a second gate sidewall, and a second sacrificial gate material, and a top portion of a third sacrificial gate structure, the third sacrificial gate structure comprises a third gate hard mask, a third gate sidewall, and a third sacrificial gate material;

recessing an exposed portion of the second gate hard mask and the second gate sidewall to expose a surface of the second sacrificial gate material;

recessing an exposed portion of the third gate hard mask and the third gate sidewall to expose a surface of the third sacrificial gate material;

forming a dielectric cap over the exposed surfaces of the second sacrificial gate material and the third sacrificial gate material.

12. The method of claim 11, wherein forming the double diffusion break cavity in the second region of the substrate further comprises:

removing portions of the interlayer dielectric between the second sacrificial gate structure and the third sacrificial gate structure to expose a surface of the substrate in the second region; and recessing the exposed surface of the substrate in the second region.

* * * * *